United States Patent [19]
Bluzer

[11] Patent Number: 4,829,354
[45] Date of Patent: May 9, 1989

[54] DRIFT FIELD SWITCH

[75] Inventor: Nathan Bluzer, Silver Spring, Md.

[73] Assignee: Westinghouse Electric Corp., Pittsburgh, Pa.

[21] Appl. No.: 212,923

[22] Filed: Dec. 4, 1980

[51] Int. Cl.⁴ .................................... H01L 27/14
[52] U.S. Cl. ............................ 357/30; 357/23.14; 357/24; 357/59
[58] Field of Search ........... 357/24 R, 24 CR, 24 M, 357/30, 23.14, 59 F, 59 G

[56] References Cited

U.S. PATENT DOCUMENTS

| | | | |
|---|---|---|---|
| 3,996,600 | 12/1976 | Patrin | 357/24 LR |
| 4,067,001 | 1/1978 | Hoffmann | 357/24 |
| 4,168,444 | 9/1979 | van Santen | 357/24 LR |
| 4,245,233 | 1/1981 | Lohstroh | 357/24 LR |
| 4,273,596 | 6/1981 | Gutierrez et al. | 357/16 |

*Primary Examiner*—William D. Larkins
*Attorney, Agent, or Firm*—W. G. Sutcliff

[57] ABSTRACT

A drift field switch incorporating a layer of semiconductor material having a first conductivity type, two spaced apart regions having the same conductivity type or a second conductivity type which function as summing buses, a layer of resistive material positioned over and insulated from the material extending between the two regions to generate a lateral electric field in the material at times a voltage is placed across the resistive material. The drift field switch overcomes the problem of providing on and off switches to steer charge to one of a plurality of summing buses.

23 Claims, 5 Drawing Sheets

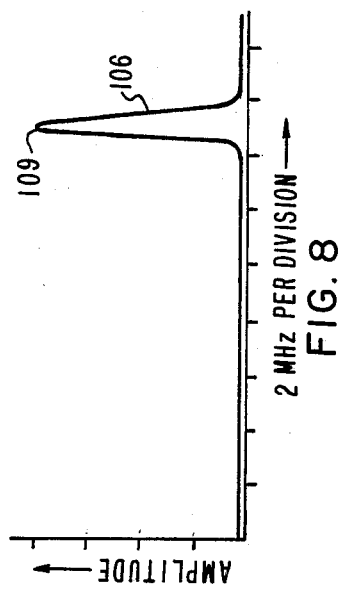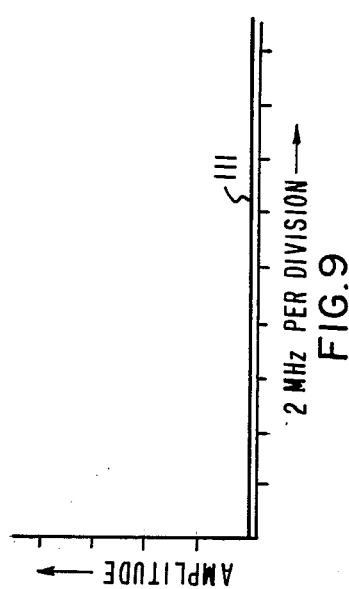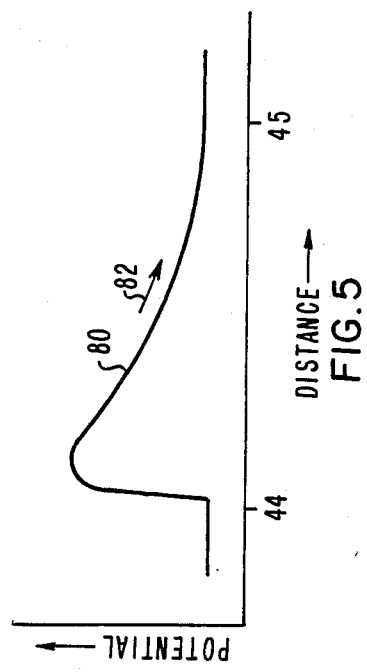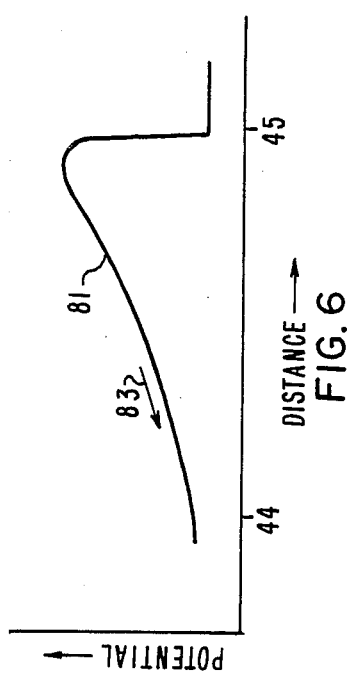

DRIFT FIELD SWITCH

GOVERNMENT CONTRACT

The Government has rights in this invention pursuant to Contract No. N00039-79-C-0127 awarded by the Department of the Navy.

BACKGROUND OF THE INVENTION

1. Field of the Invention

This invention relates to semiconductor devices and more particularly to a switch for electro-optical signal processing.

2. Description of the Prior Art

In the prior art, the output current signal from a number of photodetectors were each coupled to one of two summing buses by utilizing MOS switching transistors. The photogenerated signal current from the photodetector may have frequency components or a bandwidth as high as 1 GHz. The signal photocurrent may be typically in the range from $10^{-8}$ to $10^{-6}$ amps. The frequency response of the switching transistors is limited because the 3 db corner frequency, $f_c$, of the transistor switches is governed by the input node capacitance, C, and the transconductance, $g_m$, according to the relation $f_c = g_m/2\pi C$.

At low current levels, for example at $10^{-6}$ amps, the $g_m$ of MOS and/or bipolar transistor switches is limited by and directly proportional to the current flowing through the switch. The frequency response of the transistor switches may be increased by adding an auxiliary dc or bias current to obtain a higher $g_m$. However, the additional current flowing through the transistor switch produces a significant additional noise current which further corrupts the photogenerated signal. The additional noise from the auxiliary bias current reduces the signal to noise ratio of the photogenerated signal after passing through a transistor switch.

The transistor switches referenced in this application are normally preprogrammed by a shift register. The switches remain in their preprogrammed state for long periods of time or can be changed electronically with the shift registers. The device is utilized when the transistor switches have realized their steady state condition.

It is therefore desirable to provide a programmable device for steering of low level high frequency, for example $\approx 1$GHz, current between one or more summing buses beyond the transconductance limitation encountered in conventional MOS and/or bipolar switches.

It is further desirable to provide a structure for steering currents in the range from $10^{-8}$ to $10^{-6}$ amps having frequency components as high as 1GHz from a source of electronic charge, e.g. radiant energy absorbed in a photodetector, to one of two summing buses.

SUMMARY OF THE INVENTION

In accordance with the present invention, a method and apparatus is provided for steering charge in a semiconductor material from a source of electronic charge, such as photogenerated charge, by generating a lateral electric field in the semiconductor material in a first direction, and collecting the charge moving in the first direction. A device for steering electronic charge may comprise a layer of semiconductor material of a first conductivity type having first and second spaced apart regions or summing buses of the same conductivity type or a second conductivity type, a layer of insulation overlying the semiconductor material and a layer of resistive material overlying the insulation extending over and between the first and second regions, or summing buses, and adapted for coupling a voltage across the resistive material to provide a voltage gradient in the area between the first and second regions, to provide a lateral electric field in the semiconductor layer below the resistive material to steer the electronic charge toward one of the summing buses. A plurality of devices may be coupled in parallel across two summing buses.

BRIEF DESCRIPTION OF THE DRAWINGS

FIGS. 5 and 6 are graphs showing the electric field between the summing buses of FIGS. 2 and 7B during operation.

FIGS. 8 and 9 are graphs showing the operation of an electro-optical signal processor of FIG. 7B.

DESCRIPTION OF THE PREFERRED EMBODIMENT

Figure 1:
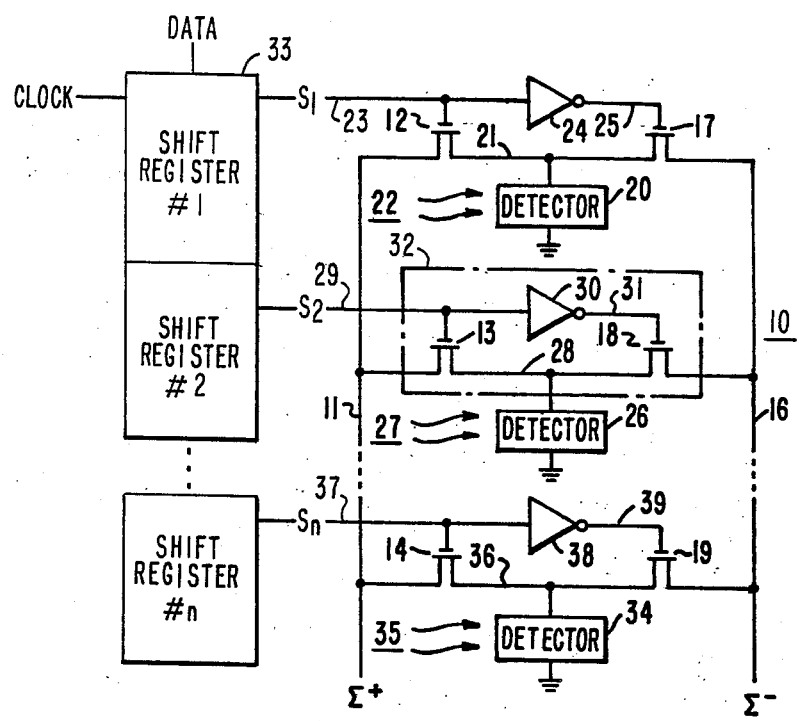
FIG. 1 shows a schematic of a prior art steering network of an electro-optical signal processor.

Referring now to the drawing and in particular to FIG. 1, a prior art steering network 10 of an electro-optical signal processor is shown. A summing bus 11 is coupled to one side of transistors 12, 13 and 14. A second summing bus 16 is coupled to one side of transistors 17, 18 and 19. The other side of transistors 12 and 17 are coupled together and to the output of photodetector 20 over line 21. Photodetector 20 is responsive to radiant energy 22. A control signal such as S1 on line 23 is coupled to the gate of transistor 12 and to an input of inverter 24. The output of inverter 24 is coupled over line 25 to the gate of transistor 17. Signal S1 is a binary signal causing either transistor 12 to be on and transistor 17 to be off or vice versa resulting in steering the output current from detector 20 to either summing bus 11 or 16.

In a likewise manner, detector 26 which is responsive to radiant energy 27 has an output coupled over line 28 to steering circuitry 32, line 28 is coupled to one side of transistors 13 and 18 coupled in common. A control signal S2 is coupled over line 29 to the gate of transistor 13 and to an input of inverter 30. The output of inverter 30 is coupled over line 31 to the gate of transistor 18.

Photodetector 34 is responsive to radiant energy 35 having an output coupled over line 36 to one side of transistors 14 and 19 coupled in common. A switch control signal $S_n$ is coupled over line 37 to the gate of transistor 14 and the input of inverter 38. This function or signals is provided by a static shift register stage 33.

The output of inverter 38 is coupled over line 39 to the gate of transistor 19. As shown in FIG. 1, any number of photodetectors may be combined using steering circuitry 32 and coupled to summing busses 11 and 16. Also, two distinct shift registers, S/R, each loaded with the complement of the other can be used instead of the inverter (24, 30, 38).

Figure 2:
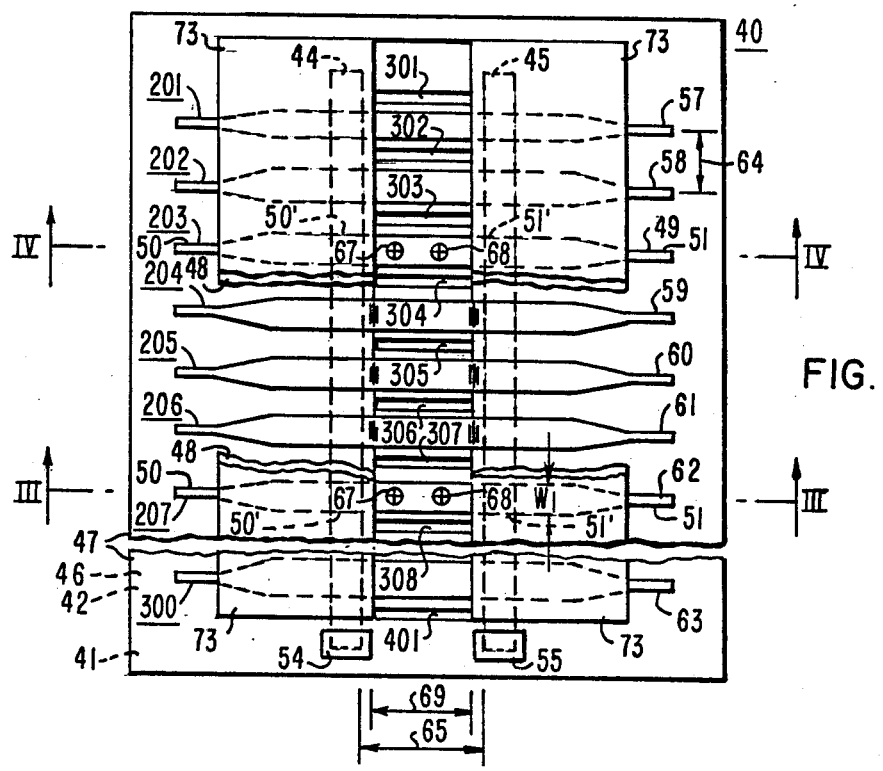
FIG. 2 shows one embodiment of the invention.
Figure 3A:
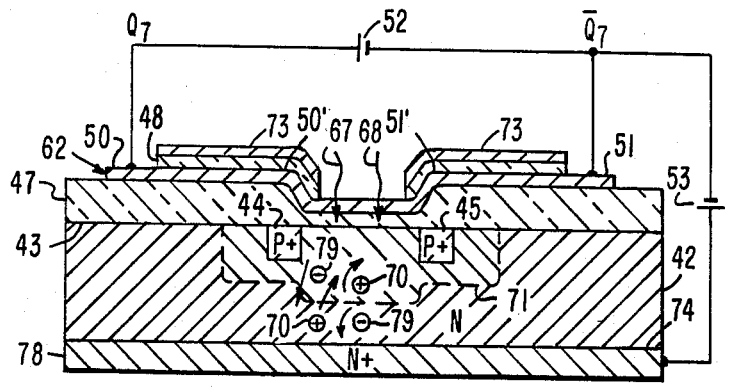
FIG. 3A shows a cross section view along the lines III—III of FIG. 2, illustrating an alternative embodiment.

Referring to FIGS. 2 and 3A, one embodiment of the invention is shown comprising a layer of semiconductor material 42 having a conductivity type such as N type. Buses or regions 44 and 45 are formed within the layer of semiconductor material 42, are spaced apart and are of a conductivity type such as P+. The regions may be formed, for example, by diffusing or implanting impurities through upper surface 43 of layer 42. Over layer 42 is formed an insulation layer 47 which may, for example, be 1,000 Angstroms thick in the space located between regions 44 and 45 and thicker outside these regions to reduce capacitance. Above insulation 47 is formed an electrode gate or layer 62 of resistive material. Electrode 62 of resistive material may for example be tin oxide, polysilicon, or thin aluminum having a resistance, for example, of 2,000 ohms per square or more. The resistance per square is adjusted to limit power dissipation when a voltage is placed across layer 62 for example between ends 50' and 51' where ends 50 and 51 are extended beyond ends 50' and 51' for electrical contact to control signals $Q_7$ and $\overline{Q}_7$ respectively. Electrode 62 functions to provide a lateral electric field within region 42 between the P+ buses or regions 44 and 45 at times a voltage $Q_7$ and $\overline{Q}_7$ is applied.

As shown in FIG. 2, electrode 62 has a width W1 which is uniform in the region between buses or regions 44 and 45. Electrode 62 is adapted for coupling to a voltage $Q_7$ and $\overline{Q}_7$ thereacross by means of voltage source 52 at ends 50 and 51 such that a potential difference represented by voltage source 52, results between points 50' and 51'. The potential difference between ends 50 and 51 can be formed by logic circuitry which are connected to these points and are in complementary logic states relative to one another such as $Q_7$ and $\overline{Q}_7$ shown in FIG. 3A. The logic states may be provided to each detector of a plurality of detectors by two shift registers, one holding the complement state of the other and coupled across the detector at ends 50 and 51, for example. Alternately, an inverter circuit may be used to form the complement logic state. Buses or regions 44 and 45 are adapted for coupling an output signal through insulation layer 47 such as by aluminum contact pads 54 and 55. Similarly, aluminum may be deposited on ends 50 and 51 to facilitate ohmic contact between electrode 62 and the logic circuitry which produce a potential difference, represented by voltage source 52, across gate or layer 62.

In addition to electrode 62, of resistive material, other electrodes or layers 49, 57 through 61 and 63 are shown each having a profile represented by FIG. 3A by electrode 62, and each extending over and between regions 44 and 45, having ends similar to 50 and 51 suitable for coupling to external voltage sources, which may for example be two shift registers, to form drift field switches or elements 201 through 300 to form a hundred detector and switch steering network 40.

As shown in FIG. 2, electrodes 49 and 57 through 62 are positioned in parallel to one another having a center to center spacing shown by arrow 64 which may for example be 31 micrometers. Regions 44 and 45 may for example be parallel to one another and have a spacing between their inner edges of about 31 micrometers as shown by arrow 65 with the spacing being in the range of 10 to 50 micrometers.

As shown in FIGS. 2 and 3A, radiant energy, represented by arrows 67 and 68, impinges the area volume located midway between regions 44 and 45 such as the center 20 micrometer width of the 31 micrometer space between represented by arrow 69 shown in relation to arrow 65 and defined by the aperture formed by layer 73. The aperture formed by layer 73, which may be for example aluminum, will limit or block radiant energy from impinging closer than 5½ micrometers to regions 44 and 45 with the charge being generated a distance of from 0.1 to 0.4 of the distance between regions 44 and 45, with the The material selected are such that electrode 62 is suitable to permit radiant energy to substantially pass through and be absorbed in layer 42 wherein mobile electronic charge is photogenerated.

In FIG. 2 narrow slots 301-308 and 401 are shown between drift field switches 201-207 and 300 to improve optical and electrical isolation between detectors. The slots may be 10 micrometers deep into layer 42 and may be formed by preferential etching. For example if layer 42 is silicon and has a surface in the <110> crystalline plane then narrow slots 1 to 2 micrometers wide having side walls in the <111> plane may be etched which is well known by one skilled in the art.

Figure 3B:
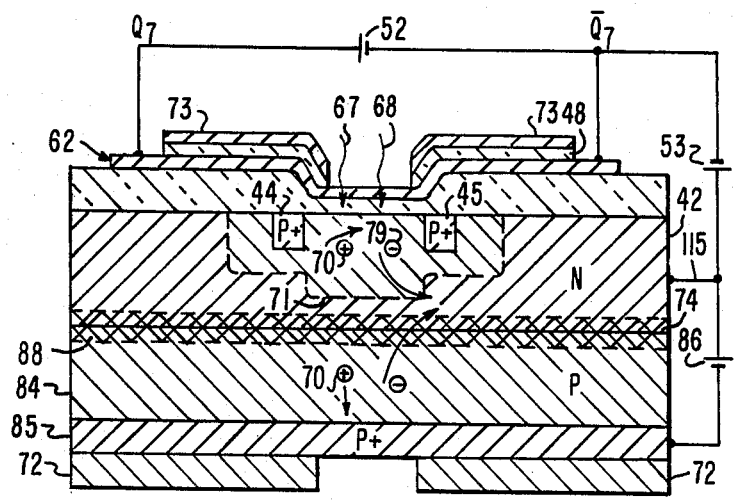
FIG. 3B shows an alternate cross section view along the lines III—III of FIG. 2.
Figure 4:
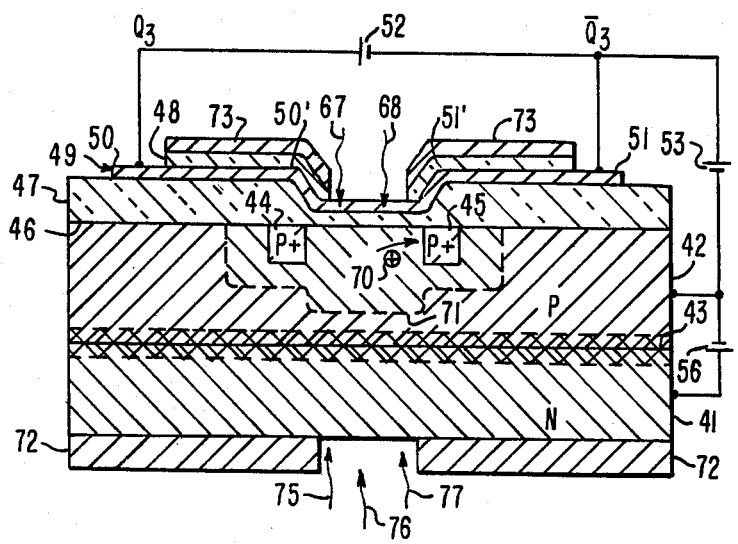
FIG. 4 shows a cross section view along the lines IV—IV of FIG. 2 illustrating an alternate embodiment.

FIGS. 3A, 3B and 4 show electronic charge 70 generated in response to absorption of radiant energy from arrows 68 and 67. Upon applying a voltage between ends 50 and 51 of electrodes 49 and 62, and between layer 42 and electrodes 49 and 62 by means of voltage source 53, a depletion region 71 will form in layer 42 containing a lateral electric field, within the depletion region, caused and generated by the voltage applied across ends 50 and 51. The lateral electric field in depletion region 71 will cause the electronic charge or holes 70 to migrate either towards region 45 or 44. For the potential diagram in FIG. 3A, the holes will migrate to region 45. Photogenerated electrons 79 in layer 42 will be attracted to the N+ layer 78 in contact with region 42 by the voltage applied from voltage source 53. Layer 78 functions as a low resistance conductor.

For optimum performance, radiant energy 68 and 67 should be of a wavelength which has a high absorption coefficient within layer 42. With a high absorption coefficient, most of the radiant energy 68 and 67 will be absorbed near to the surface 43 of layer 42 and will be under the influence of the lateral electric field formed under layer 62.

FIG. 3B shows an alternate cross section view along the lines III—III of FIG. 2 illustrating an alternate embodiment of the invention except layer 78 is deleted. In FIG. 3B like references are used for functions corresponding to the structure of FIG. 3A. In FIG. 3B a substrate 84 which may be P type is shown positioned below layer 42. A P+ layer 85 is shown on the underside of substrate 84 to provide low ohmic contact across the underside of substrate 84. Voltage source 86 is shown coupled between layer 85 and layer 42. A depletion region 88 is formed by the voltage from voltage source 86 across the N/P junction of layer 42 and substrate 84. Depletion region 88 can touch and merge with the depletion region 71 produced by the potential applied to the gate electrode 62. All the holes 70' generated in region 84 will be collected by the battery 86. Whereas the holes 70 generated in region 42 will be collected by one of the summing buses 44, 45. The photogenerated electrons will emerge at line 115.

If a hetrojunction is used, then radiant energy can be incident from the underside through layer 85 and limited by aperture 72. For example, Indium Antimonide, InSb, may be used for the N type layer 42 and Indium Arsenide, InAs, may be used for the P type substrate 84. The InAs will be transparent to the longer wavelength which will be absorbed by the InSb layer 42 of approximately 3-5 micrometers.

FIG. 4 shows a cross section view along the lines IV-IV of FIG. 2 illustrating another alternate embodiment of the invention. In FIG. 4 like references are used for functions corresponding to the structure of FIG. 3A except layer 78 is deleted and layer 42 is of P-type material. In FIG. 4 a substrate 41 which is N-type is shown positioned below P-type layer 42. A voltage source 56 is coupled between substrate 41 and layer 42.

In FIG. 4, the geometry selected is such that layer 42 is sufficiently thin to satisfy two requirements. First it should be possible to deplete layer 42 of majority carriers between regions 44 and 45 by reverse biasing PN junction 43 with voltage source 56 and by applying a depletion potential to electrode 49 by voltage source 53. Secondly, the potential profile within the depleted region in layer 42 between regions 44 and 45 should have a lateral component resulting from the potential bias applied across electrode 49 by voltage source 52. For optimum performance, radiant energy 68, 67 should be of a wavelength which has a high absorption coefficient within layer 42. With a high absorption coefficient, most of radiant energy 68, 67 will be absorbed very close to the surface 46 of layer 42 under the influence of the lateral electric field. For the structure shown in FIG. 4, the radiant energy can also be incident through the back as shown by radiant energy 75, 76 and 77 and the aperture formed by layer 72 and still be absorbed close to electrode 49, a hetrojunction is used. The hetrojunction will be a combination of a P and N semiconductor materials where the P-type material has a much higher absorption coefficient than the N-type material for the wavelength spectrum of the incident radiant energy.

In FIG. 4, the isolation slots 301-401 shown in FIG. 2 are sufficient for the improved isolation for the devices. These slots are also applicable to Figures 3A and 3B producing the same improvements. However the device shown in FIG. 4 an N type region will be required in addition to, or in place of, the optional isolation groove between drift field switches 201-301. The addition of conductive narrow and long N regions 301-401 will be used to drain the electrons transported to the surface 46 of the device shown in FIG. 4. Electrical contact will be necessary with the N type regions 301-401 located between individual detectors. A positive bias relative to regions 44 and 45 will be applied to these narrow N type regions such as the potential of substrate 41 from voltage source 56. The N regions 301-401 may be formed by diffusing impurities into the surface 46 or diffusing impurities into the etched slots 301-401. If the grooves are deep enough to reach the N-type layer 41 then N-type impurities diffused into them will form contact between the N-type material inside the grooves and layer 41.

FIGS. 5 and 6 are graphs showing the potential in depletion region 71 within layer 42 of FIGS. 3A or 3B as a function of distance between regions 44 and 45 when electrode 49 of resistive material has a voltage applied across its ends. In FIGS. 5 and 6, the ordinate represents potential and the abscissa represents distance along layer 42 in the direction between regions 44 and 45 and near surface 43. In FIG. 5, curve 80 represents the potential in depletion region 71 where end 50 has applied a positive voltage with respect to end 51. In FIG. 6, curve 81 represents the potential in depletion region 71 for the case where the potential applied to end 51 is more positive than end 50. In FIG. 5, arrow 82 represents the direction of charge flow, holes, moving in the direction of the electric field down the potential curve 80 toward region 45. In FIG. 6, arrow 83 represents the direction of charge flow, holes, in the direction of the electric field down the potential curve 81 toward region 44. The voltage across layer 49 between ends 50 and 51 shown in FIG. 3A as Q and $\overline{Q}$ may for example be in a range of 10 to 20 volts, the voltage of ends 50 and 51 being negative with respect to layer 42 by a voltage of 10 to 20 volts.

Figure 7A:
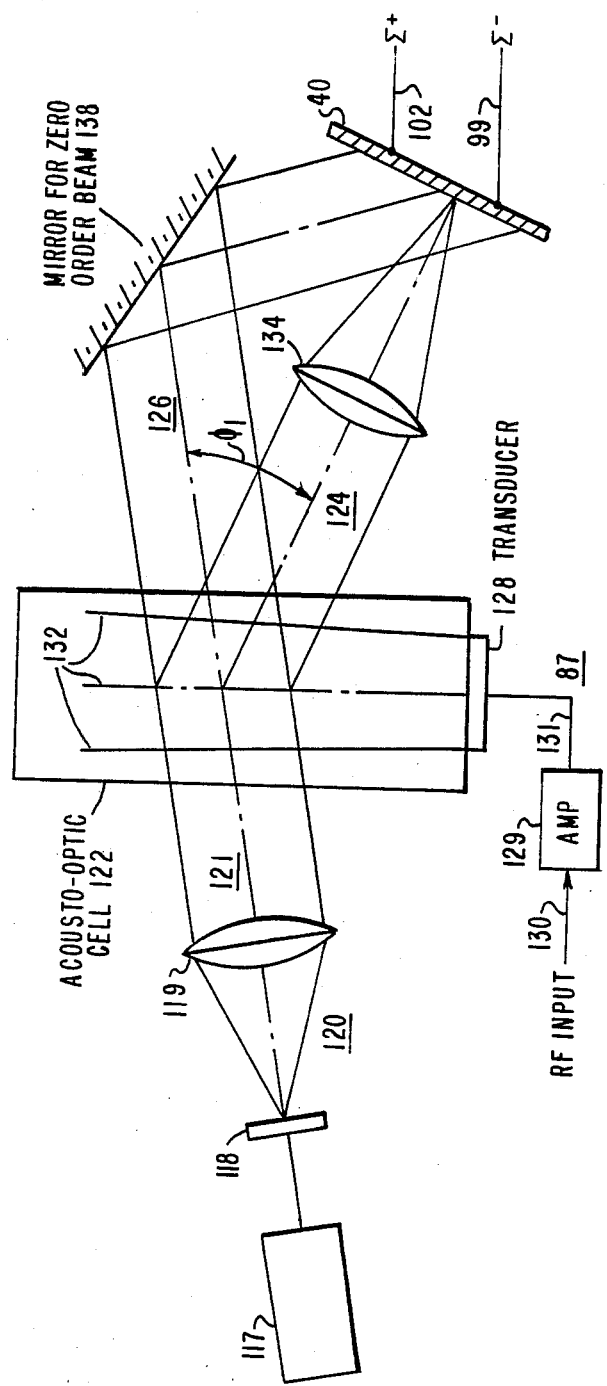
FIG. 7A is a block diagram of an electro-optical signal processor utilizing the detector with steering network shown in perspective in FIG. 2.

FIG. 7A is a block diagram of an electro-optical signal processor 87 utilizing the detectors 201 through 300 with associated steering networks 40 shown in FIG. 2. Signal processor 87 is shown as a programmable electrical bandpass filter. The programmable capability is provided by selecting the true or complement logic states such as Q and $\overline{Q}$ for connection across detectors 201 through 300. The filter configuration has been proposed by others in the art such as in an article in IEEE Spectrum, May 1967, pp 42.

In FIG. 7A, a laser beam 121 is passed through an A-O Bragg cell 122 which splits the incident laser beam into deflected 124 and undeflected components 126. The deflected beams are caused by the moving volume phase grating formed by acoustic waves launched in the Bragg cell by the RF driven transducers 128. These acoustic waves modulate the A-O cell's 122 index of refraction in time and space. The modulation produces one or more deflected optical beams 124 which for our purpose are spatially resolved and correspond to the RF signals, such as 1 GHz, applied to the Bragg device. This operation corresponds to an instantaneous Fourier transform of the applied RF signal 130. Besides this electrical to spatial transform, each spatially resolved optical beam 124 is doppler shifted in frequency corresponding to the applied RF signal 130 given by $(\nu_o + \nu^*)$ or $(\nu_o - \nu^*)$ where $\nu^*$ is the frequency of the applied RF signal. The direction of the acoustic wave 132 in relation to the optical beam determines whether the diffracted optical beam 124 is doppler up-shifted or down-shifted. The undeflected laser beam 126 of frequency $\nu_o$ is also imaged upon the photosensor array.

The superposition of the zero order beam 126 and diffracted laser wavefronts 124 reaching the array produce optical mixing. The intensity profile is proportional to the square of the summed laser wave amplitudes. The resultant intensity in a resolved spot will contain frequency products of $\nu_o$, and the doppler shifted frequency $(\nu_o + \nu^*)$. The result is a component at $2\nu_o + \nu^*$ (or $2\nu_o - \nu^*$) and $\nu^*$. Since the laser's optical frequency is around $10^{14}$ Hertz, the sensor will only respond to the lower doppler shifted frequency beat note located within the RF band. Thus the output from a given detector, e.g. 201-301, proportional to the incident laser amplitude, will have a frequency bandpass spectrum dependent on its geometric location, that is, each detector pixel of the sensor, occupying a different spatial location, will receive different RF frequencies. However, each pixel must have a sufficient frequency response to accommodate the beat note frequency present in the laser beam's intensity.

In operation, electro-optic filter 87 has an input terminal adapted for receiving signals which may have high frequency components in the microwave frequency range such as 1 GHz which is coupled over transmission line 130 to an optical modulator 122 which functions to modulate laser beam 121. Laser beam 121 originates from laser 117. Laser beam 121 is directed through modulator 122 where a portion of beam 121 is deflected responsive to the radio frequency signals to form one or more beams 124 each at a respective angle $\phi_1$ through $\phi N$. The beam at angle $\phi_1$ impinges upon a particular electrode such as 207 and passes through into the semiconductor material where a portion is absorbed causing photogenerated charges. A mirror 138 reflects undeflected beam 126 to the same volume of semiconductor material where a portion is absorbed.

Figure 7B:
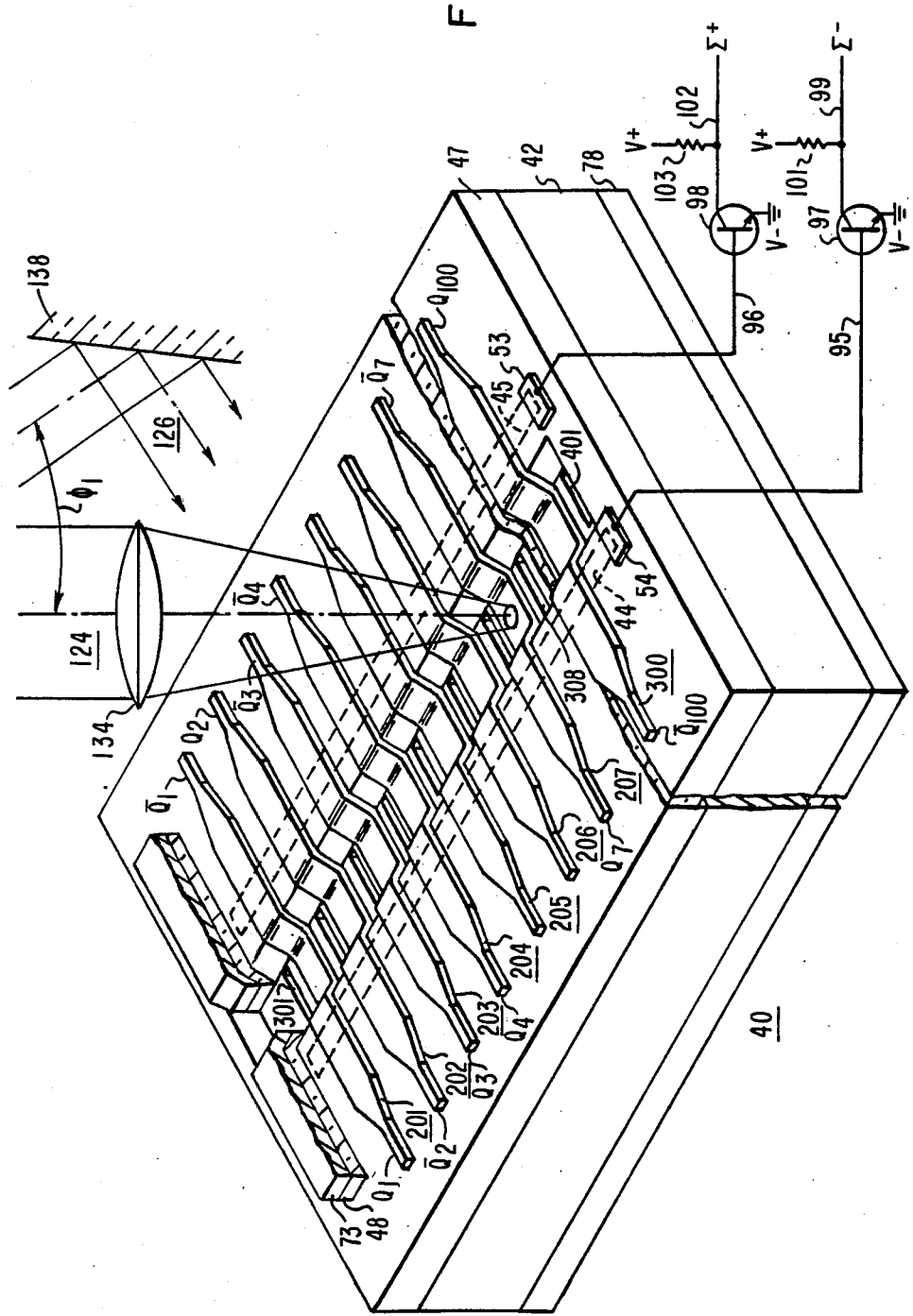
FIG. 7B is an isometric view of the detector with steering network in FIGS. 2 and 7A.

FIG. 7B is an isometric view of the detector and steering network 40 along with radiant energy from deflected and undeflected beams 124 and 126 shown in FIG. 7A. Deflected beam 124 and undeflected beam 126 have radiant energy absorbed therefrom in the volume below electrode 207 causing photogenerated charge in the region between regions 44 and 45 to provide an output on either lines 95 and 96 depending on $Q_7$ and $\overline{Q}_7$. Lines 95 and 96 are coupled to the base of transistors 97 and 98 respectively. The emitter of transistors 97 and 98 are coupled to a negative voltage supply, V—. The summing buses can also each be connected to the emitter of a common base transistor. The collector of transistor 97 is coupled over line 99 to an output terminal and to one side of resistor 101. The collector of transistor 98 is coupled over line 102 to an output terminal and to one side of resistor 103. The other side of resistors 101 and 103 are coupled to a voltage supply which may be positive with respect to the emitter. Lines 99 and 102 represent the output of summing busses 44 and 45 respectively which have accumulated the photogenerated charge on the respective bus from element 207 depending upon the voltage such as $Q_7$ and $\overline{Q}_7$ across the resistive layer overlying the region in between regions 44 and 45 where photocharge is generated. Additional deflected laser beams 124 at angles $\phi_1$ through $\phi_N$ may be directed at other elements 201 through 300 of detector 40.

FIGS. 8 and 9 are graphs showing the operation of element 207 of detector 40 in electro-optical filter 87 of FIGS. 7A and 7B with laser beam 121 on and beams 124 and 126 impinging electrode 207. In FIGS. 8 and 9 the ordinate represents amplitude and the abscissa represents frequency. A radio frequency signal was coupled to transmission line 130 in FIG. 7A and fed to modulator 122 which modulated the laser beam 121. With the voltages, $Q_7$ and $\overline{Q}_7$ set the laser beam was directed at element 207 causing an output on summing bus 45 and line 96 or at its output on line 102 having a signal as shown in FIG. 8 by curve 106 having a signal frequency peak 109 corresponding to the frequency peak of the signal on line 130. The output of the other summing bus on line 99 is shown by curve 111 in FIG. 9 and carried no amplitude peaks at the corresponding signal frequency of amplitude peaks 109 in FIG. 8. As much as 40 decibel isolation was observed between summing buses 44 and 45 or lines 99 and 102. Of course, by reversing the state of $Q_7$ and $\overline{Q}_7$ the response on lines 102 and 99 would be reversed.

A method and apparatus has been described for steering charge in a depletion channel in a semiconductor material comprising the steps of generating a lateral electric field in the channel in a first direction and collecting charge moving in the first direction.

The invention further provides apparatus for steering charge comprising a layer of semiconductor material having a first conductivity type and having a first surface, first and second spaced apart regions within the semiconductor layer having a second conductivity type, a layer of resistive material positioned over the first surface and extending between the first and second regions and adapted for coupling a voltage across the layer of resistive material in the area between the first and second regions, means for insulating the layer of resistive material from the first surface, means for positioning charge in the layer of semiconductor material in the area between the first and second regions. The layer of resistive material, the semiconductor layer and the first and second regions are adapted for coupling voltages therebetween for forming a depletion region underneath the first surface in the volume between the first and second regions.

I claim:

1. Apparatus for steering and collecting charge comprising:
   a layer of semiconductor material having a predetermined conductivity type and having a first surface,
   first and second spaced apart summing bus regions within said semiconductor layer, which regions are doped with a selected conductivity type,
   a first layer of resistive material positioned over said first surface and extending between said first and second regions and adapted for coupling a voltage across said layer of resistive material in the area between said first and second regions, such that a depletion region can be formed in the semiconductor material between the spaced apart summing bus regions,
   means for insulating said layer of resistive material from said first surface,
   means for positioning charge in said layer of semiconductor material in the volume between said first and second regions,
   voltage means coupled to the extending ends of the resistive material for generating in a first time period a lateral electric field in a first direction forming the depletion region within the semiconductor material and steering and collecting charge moving in said first direction in the first summing bus region, and for generating in a second time period an opposed lateral electric field in a second opposed direction forming the depletion region within the semiconductor material and steering and collecting charge moving in said second opposed direction in the second summing bus region.

2. The apparatus of claim 1 wherein said layer of semiconductor material is supported by a semiconductor substrate of an opposed conductivity type.

3. The apparatus of claims 1 or 2 wherein said semiconductor material conductivity type is N type and said summing bus region conductivity type is P type.

4. The apparatus of claims 1 or 2 wherein said semiconductor material conductivity type is P type and said summing bus regions conductivity type is N type.

5. The apparatus of claim 2 wherein said semiconductor substrate and said layer are adapted for coupling a voltage therebetween for forming a second depletion region extending from said semiconductor substrate into said layer.

6. The apparatus of claim 5 further including voltage sources coupled to said resistive material, semiconductor layer and said semiconductor substrate and adjusted in potential to cause said second depletion region and said first depletion region to join.

7. The apparatus of claim 1 wherein said resistive material is transparent to radiant energy of a predetermined wavelength.

8. The apparatus of claim 1 wherein said means for positioning charge includes radiant energy directed into said volume between said first and second regions.

9. The apparatus of claim 8 further including means for masking radiant energy from said first and second regions and adjacent areas a predetermined distance towards said other region.

10. The apparatus of claim 1 further including a second layer of resistive material spaced apart from said first layer of resistive material and over said first surface and said means for insulating and extending between said first and second regions and adapted for coupling a voltage across said layer of resistive material in the area between said first and second regions, a second means for positioning charge in said layer of semiconductor material underneath said second layer resistive material in the volume between said first and second regions, said second layer of resistive material and said semiconductor layer adapted for coupling a voltage therebetween for forming a second depletion region underneath said first surface in the volume between said first and second regions underneath said second layer of resistive material.

11. The apparatus of claim 1 further including means for reversing the polarity of the voltage across said layer of resistive material.

12. The apparatus of claim 1 wherein said first and second regions are spaced in the range from 10 to 50 micrometers.

13. The apparatus of claim 1 wherein said means for positioning charge positions charge in the volume between said first and second regions a predetermined distance from said first and second regions.

14. The apparatus of claim 13 wherein said predetermined distance is in the range from 0.1 to 0.4 the distance between said first and second regions.

15. The apparatus of claim 1 further including means for generating a signal in response to the charge collected by said first region.

16. A method for steering charge in a depletion volume in a semiconductor material comprising the steps of:

generating a lateral electric field in the depletion volume in a first direction during a first time period.

collecting charge moving in said first direction during said first time period, generating a lateral electric field in the depletion volume in a second direction during a second time period, collecting charge moving in said second direction during said second time period.

17. The apparatus of claim 2 wherein junction of said layer of semiconductor material and said substrate forms a heterojunction.

18. The apparatus of claim 17 wherein said means for positioning charge includes a lower surface on said substrate suitable for passing incident radiant energy.

19. The apparatus of claim 1 further including a first and second shift register each having a tap coupled to a respective end of said first layer of resistive material, said ends positioned exterior to the area between said first and second regions.

20. The apparatus of claim 19 further including means for loading predetermined data in said first shift register and complement data in said second shift register.

21. A semiconductor photosensor array in which photogenerated charge is steered and collected on opposed summing buses, which array comprises:

a layer of semiconductor material of a first conductivity type, and being absorptive of photoradiation which produces photogenerated charge within the semiconductive material;

first and second elongated, parallel, spaced apart summing bus regions within the semiconductive material, and doped to provide a predetermined conductivity;

insulating means disposed on a first surface of the semiconductive material layer;

a plurality of spaced apart, strips of resistive material disposed on the insulating means, which strips extends between and beyond the spaced summing bus regions such that a depletion region can be formed in the semiconductive material between the spaced apart summing bus regions; and potential means coupled to the extending end of the respective resistive material strips for generating a lateral electric field in the depletion region of the semiconductor material layer in a first direction during a first time period to thereby steer and collect photogenerated charge within the depletion region in the first summing bus, and in a second time period generating an opposed lateral electric field in the depletion region to steer and collect phototgenerated charge within the depletion region in the second summing bus.

22. The apparatus of claim 21 wherein said layer of semiconductor material is supported by a semiconductor substrate of a second conductivity type.

23. The apparatus of claim 22 wherein said semiconductor material conductivity type is N-type and said summing bus regions conductivity type is P-type.

* * * * *